United States Patent [19]

Hsu

[11] Patent Number: 5,491,099
[45] Date of Patent: Feb. 13, 1996

[54] METHOD OF MAKING SILICIDED LDD WITH RECESS IN SEMICONDUCTOR SUBSTRATE

[75] Inventor: Chen-Chung Hsu, Taichung, Taiwan

[73] Assignee: United Microelectronics Corporation, Hsinchu, Taiwan

[21] Appl. No.: 297,497

[22] Filed: Aug. 29, 1994

[51] Int. Cl.$^6$ ............................................. H01L 21/8234
[52] U.S. Cl. ............................ 437/35; 437/44; 437/200; 257/344
[58] Field of Search ................................ 437/44, 200, 35, 437/415 M; 257/344

[56] References Cited

U.S. PATENT DOCUMENTS

| | | | |
|---|---|---|---|
| 4,366,613 | 1/1983 | Ogura et al. | 29/571 |
| 5,270,256 | 12/1993 | Bost et al. | 437/195 |
| 5,382,534 | 1/1995 | Sheu et al. | 437/35 |

FOREIGN PATENT DOCUMENTS

| | | |
|---|---|---|
| 1181566 | 7/1989 | Japan . . |
| 621450A | 1/1994 | Japan . |
| 6163572A | 6/1994 | Japan . |

OTHER PUBLICATIONS

"Simplified Lightly Doped Drain Process", IBM Technical Disclosure Bulletin, vol. 30, No. 12, May 1988, pp. 180–181.
Rodder, "Raised Source/Drain MOSFET with Dual Sidewall Spacers", IEEE Electron Device Letters, vol. 12, No. 3, Mar. 1991, pp. 89–91.

*Primary Examiner*—George Fourson
*Assistant Examiner*—Richard A. Booth
*Attorney, Agent, or Firm*—George O. Saile

[57] ABSTRACT

A process for fabricating MOSFET devices with a recessed lightly doped drain, (LDD), has been developed. This process initially involves conventional techniques of forming a silicided polysilicon, (polycide), gate structure, isolated from the silicided source and drain regions by a spacer sidewall insulator. The novel aspect of this process consists of removing the spacer insulator and etching a trench in the region between the metal silicided source/drain and the polycide gate structure. An angled ion implant is then performed to form lightly doped drain regions in the trench region, also extending under the polycide gate. This results in a narrowing of the channel length, thus enhancing device performance.

18 Claims, 5 Drawing Sheets

METHOD OF MAKING SILICIDED LDD WITH RECESS IN SEMICONDUCTOR SUBSTRATE

BACKGROUND OF THE INVENTION

1. Field of the Invention

The present invention relates to a process in which Metal Oxide Semiconductor Field Effect Transistors, (MOSFET), devices are fabricated using specific semiconductor fabrication techniques to increase the performance of the device.

2. Description of the Prior Art

Very large scale integrations, (VLSI), has allowed the electronics industry to reduce cost while continuing to increase chip performance and chip reliability. Advances in lithographic equipment, as well as lithographic processing materials and techniques have allowed the industry to produce a dynamic random access memory, (DRAM), chip with a density approaching 256 million transistors per chip. The increased performance, resulting from reducing the device dimension, can have a negative effect on device reliability. For example device performance is enhanced as the channel region, the region under the gate electrode between the source and drain, is reduced. However the chances of a "hot electron", or impact ionization phenomena is increased due to shorter channel lengths. This phenomena can result in severe degradation to the gate oxide during the lifetime of the device thus resulting in reliability failures. Therefore the semiconductor industry has had to develop structures and processes that allow for shorter channel lengths, (enhanced performance), without risking reliability in the form of hot electron degradation.

The hot electron effect is a function of channel length, gate oxide thickness, and the dopant concentration of the source and drain regions. Since increasing channel length, or gate oxide thickness, would deleteriously impact device performance, the industry resolved the performance - reliability trade-off by engineering or optimizing the source and drain regions. The higher dopant source and drains are needed to reduce resistance, however the phenomena of impact ionization increases with increasing source and drain dopant concentrations. One method developed to maintain a short channel region while reducing the risk of hot electrons, is via the use of a lightly doped drain, (LDD), invented by Ogura et al in U.S. Pat. No. 4,366,613. This process allows the channel region to be established by a lower concentration source and drain. One example of an LDD process consists of establishing the channel length via ion implantation of a lightly doped region, defined by the polysilicon gate image. After formation of an insulator sidewall on the polysilicon gate, a higher doped ion implantation is performed to serve as the contact region for the source and drain. Therefore this process, sometimes called "drain engineering", results in narrow channel lengths for performance, low resistance source and drains for contacts, with a reduced risk of hot electron reliability failures.

There are several versions of LDDs now being used for MOSFET fabrication. This invention will show a novel technique of fabricating an LDD MOSFET in which the process not only reduces reliability risks but also uses a process in which the LDD process reduces the final channel length.

SUMMARY OF THE INVENTION

It is an object of the present invention to provide a method of fabricating a lightly doped drain, (LDD), MOSFET integrated circuit device that results in short channel lengths and provides reduced risk of hot electron reliability failures.

It is another object of this invention to form a trench in the silicon between the silicided source - drain and the polycide gate.

It is still another object of this invention to implant the LDD at an angle so that some of the implanted species is implanted in the trench recess, while some is implanted under the polycide gate.

It is yet another object of this invention to fill the trench recess with oxide, which also isolates the silicided source - drain from the polycide gate.

In accordance with this present invention a method is described for fabricating a MOSFET device by forming a field oxide pattern on a silicon substrate. A gate oxide is formed on the exposed silicon surface and a polysilicon layer is deposited and patterned to form a gate electrode structure. A spaced insulator is then formed on the sides of the polysilicon structure by low pressure chemical vapor deposition, (LPCVD), followed by anisotropic reactive ion etching, (RIE). Ion implantation is then used to form the heavily doped source and drain regions, and also dope the polysilicon gate. A self aligned silicide process is then performed via use of deposition of a metal, followed by annealing to form the metal silicide on regions in which the metal interfaced silicon. After removal of the unreacted metal in a wet etchant, a different selective wet etchant is used to completely remove the spacer insulator, exposing undoped silicon substrate. A selective RIE process is then used to create a trench in the exposed silicon substrate. An ion implantation step, performed at a specific angle is used to form the LDD regions in the exposed silicon substrate, at the sides of the trench, and partially under the polycide gate. Thermal oxidation and plamsa enhanced chemical vapor deposition, (PECVD), processing is then used to fill the trench as well as insulating exposed surfaces and isolating the silicided source - drains from the polycide gate.

BRIEF DESCRIPTION OF THE DRAWINGS

The object and advantages of this invention are best explained in the preferred embodiment with reference to the attached drawing that include.

DESCRIPTION OF THE PREFERRED EMBODIMENTS

The method for forming the recessed LDD device is now covered in detail. This recessed LDD structure can be used on MOSFET devices that are currently being manufactured in industry, therefore only the specific areas unique to understanding this invention will be described in detail.

Figure 1:
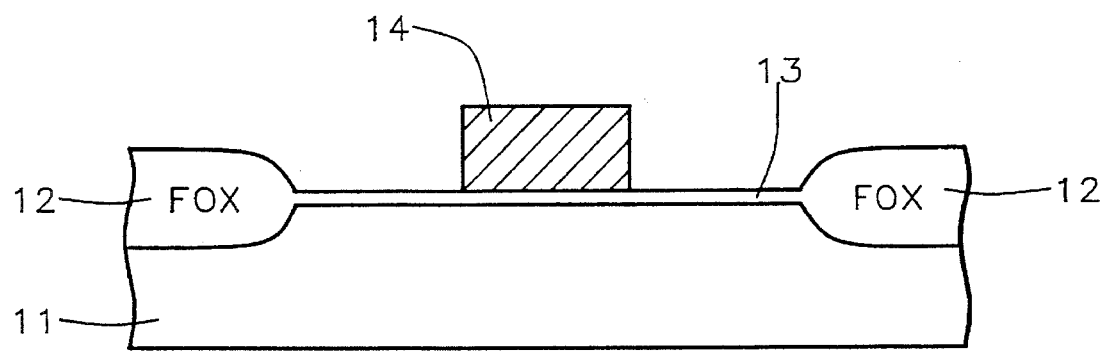
FIG. 1–9 which schematically illustrates the cross-sectional representation of key fabrication stages. The figures follow the process flow in the preferred embodiment for making the LDD MOSFET device.

Referring now to FIG. 1, a cross-sectional view of the substrate, 11, is shown. The preferred substrate is composed of P type single crystal silicon with a <100> crystallographic orientation. A thick field oxide, 12, (FOX), for isolating the device, is first formed surrounding the region where the device is to be built. Briefly, the method commonly practiced in the industry is to use a thin thermal oxide and a silicon nitride layer as masking films for the thermal oxidation needed to create the field oxide. The desired field oxide regions are etched open in the silicon nitride - silicon dioxide layer using conventional photolithographic and reactive ion etching, (RIE), techniques. A field oxide is than grown at a temperature of between about 900° to 1000° C., typically to a thickness of about 3500 to 4500 Angstroms.

After removal of the silicon nitride - silicon dioxide masking films, via use of a heated solution of phosphoric acid, (H3PO4), for the silicon nitride, and a buffered or dilute hydrofluoric acid, (HF), for the silicon dioxide, the silicon surface is carefully cleaned. Next a good quality thermal silicon dioxide film is grown to form the gate oxide, shown as 13, in FIG. 1. The preferred thickness is about 100 to 200 Angstroms, grown in 02 and steam, at a temperature between about 850° to 950° C. Next a polysilicon layer is blanket deposited using low pressure chemical vapor deposition, (LPCVD), at a temperature of between about 600° to 650° C., to a thickness of about 2000 to 3000 Angstroms. Conventional photolithography is now used to define the desired gate pattern in photoresist. The structure is now exposed to RIE using SF6 and C12 to remove the unwanted portions of the polysilicon layer and resulting in the desired polysilicon gate structure, 14, shown in FIG. 1.

Figure 2:
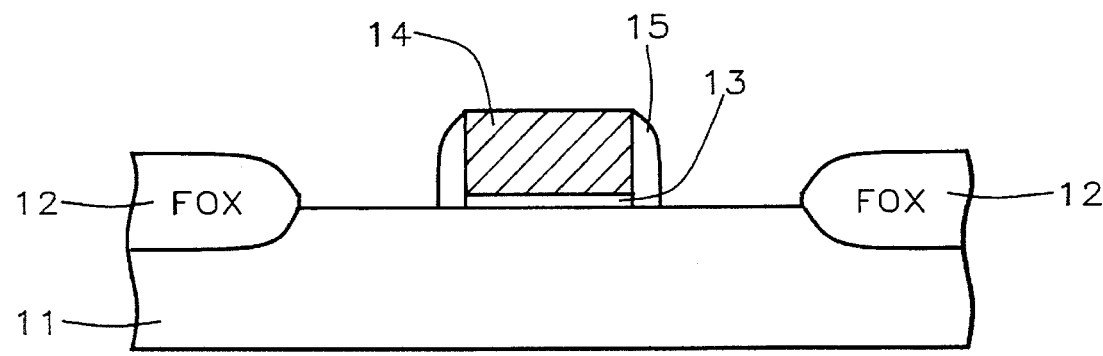

An insulator spacer, 15, shown in FIG. 2, is formed along the sides of the polysilicon gate structure, 14. The spacer is formed from a blanket LPCVD of silicon dioxide, (SiO2), to a thickness of about 500 to 1000 Angstroms, followed by an anisotropic RIE step, using CHF3 and argon, to remove the SiO2 form all areas except along the sides of the polysilicon gate structure, 14. The anisotropic etch exhibits high selectivity, that is removing SiO2 at a much greater rate than Si. This allows the exposed substrate and the top of the polysilicon gate structure to be virtually untouched at the completion of the spacer RIE step. It should be noted that the spacer insulator can also be silicon nitride, (Si3N4).

Figure 3:
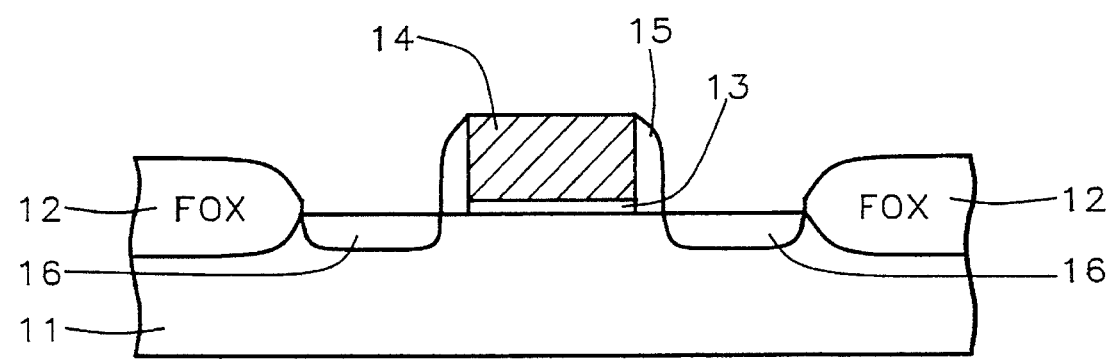

FIG. 3 shows the result of an ion implantation process employed to create the source-drain, (s/d), regions, 16, and also to dope the polysilicon gate, 14. This is accomplished using arsenic at an energy between about 50 to 100 Kev and using a dose of 1E15 to 1E16 atoms/cm2. A drive-in, performed in a conventional furnace at a temperature of between about 850° to 950° C., completes the s/d fabrication step.

Figure 4:
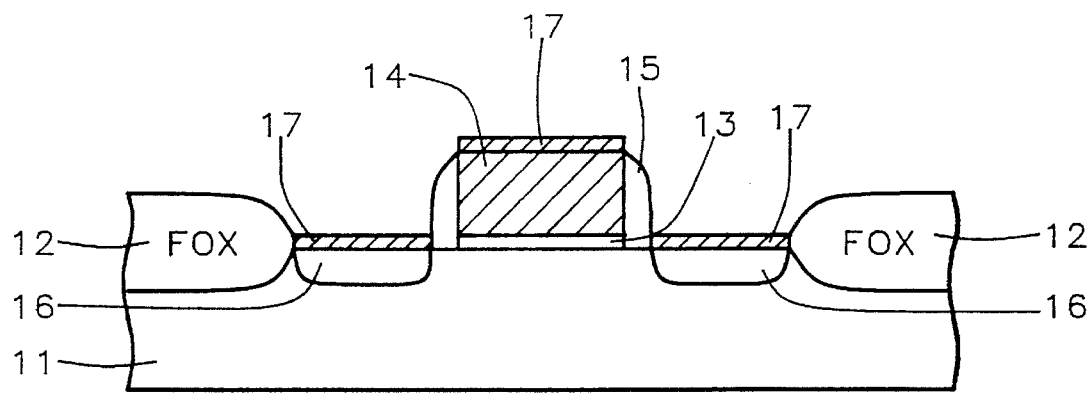

FIG. 4 shows the result of a self aligned silicide process. After a careful cleaning of the structure, a silicide forming metal, such as titanium, (Ti), is deposited, via sputtering, to a thickness of about 500 to 1500 Angstroms. Next an anneal is performed at a temperature of between 650° to 750° C., for 30 min. to convert Ti to TiSi2, on regions in which Ti interfaced Si. On areas, such as the FOX, 12, as well as the spacer insulator, 15, Ti remains unreacted and is removed selectively using NH4OH:H2O2:H2O, 1:1:5. The resulting TiSi2 layers, 17, are shown in FIG. 4 on the s/d regions as well as on the polysilicon gate, (polycide), structure.

Figure 5:
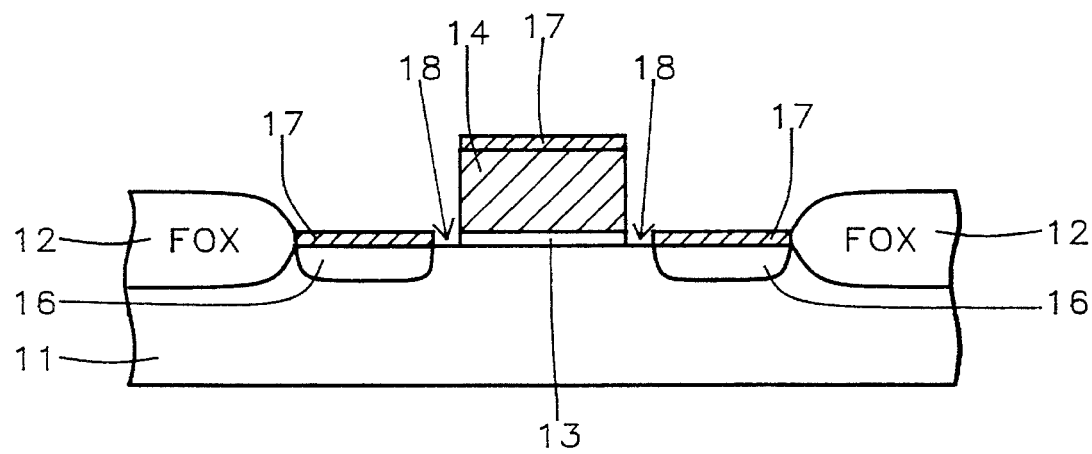
Figure 6:
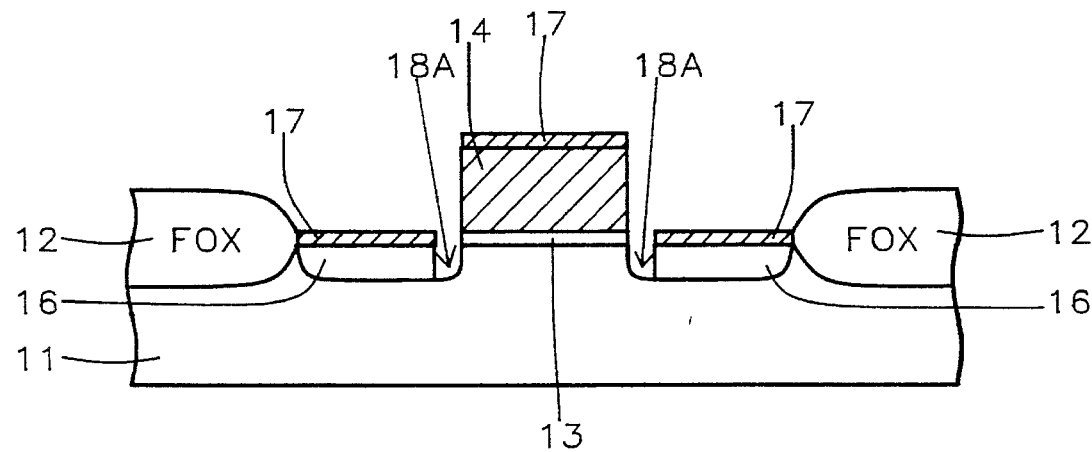

A selective etchant, CF4 and H2, is now used to completely remove the spacer insulator, exposing substrate Si, 18, shown in FIG. 5. The etch rate of the insulator is much faster via use of this RIE chemistry, than the removal rate of the exposed TiSi2 and substrate Si, thus those materials remain virtually unattacked. Next a different selective etchant, SF6 and C12, is used to create a trench, 18A, in the area of the previously exposed Si, 18. This step requires an etchant that removes Si at a much greater rate than that of TiSi2, thus creating the desired trench while not removing significant amounts of TiSi2. The trench is etched to a depth approximately equal to the depth of the diffused s/d. This is shown schematically in FIG. 6.

Figure 7:
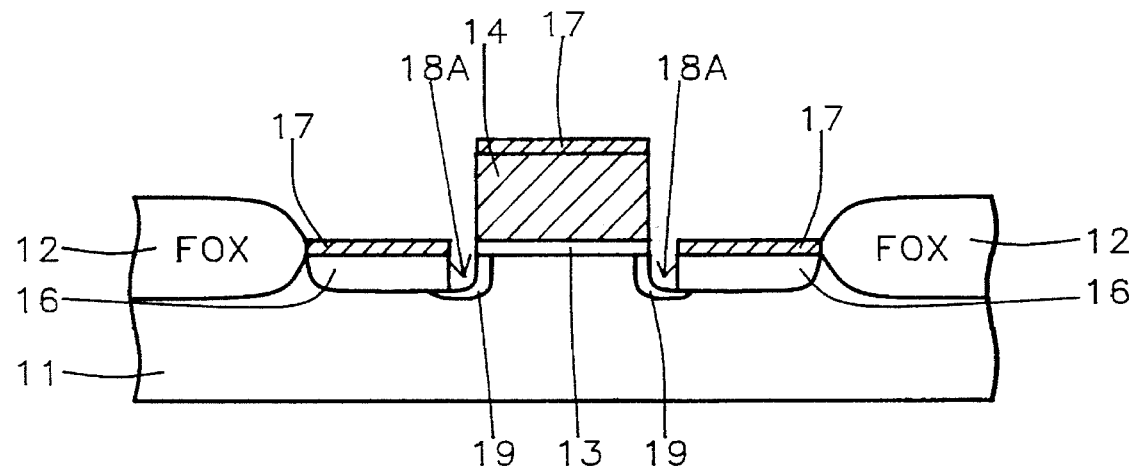

A recessed, lightly doped drain, (LDD) is now created and shown as regions 19, in FIG. 7. This is accomplished by ion implantation of phosphorous at an energy between about 50 to 70 Kev, and at a dose about 1E13 to 1E14 atoms/cm2. The critical condition used for this I/I LDD step is the implant angle of 20 to 45 degrees used to impart some phoshorous under the polycide structure. This results in channel lengths considerably shorter than counterparts fabricated without the use of the recessed LDD process.

Figure 8:
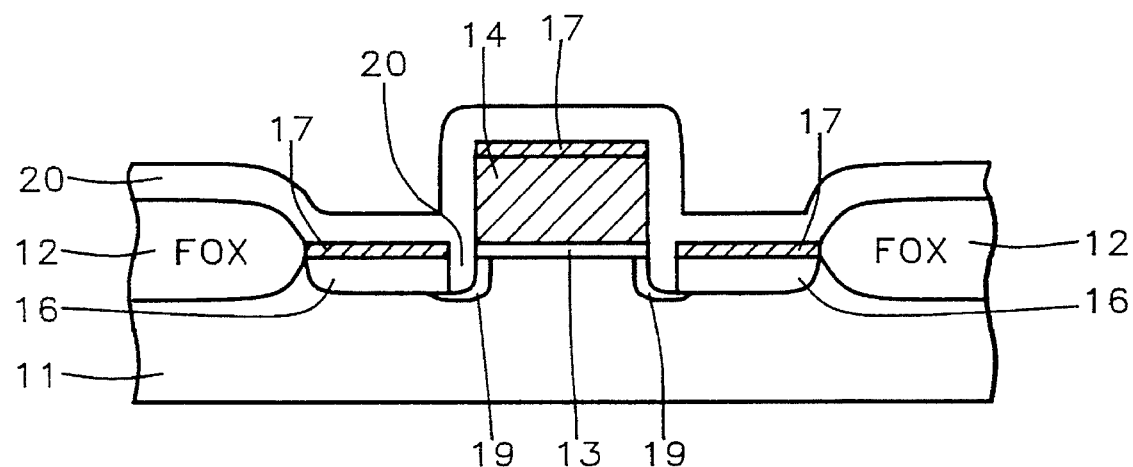

A thermal oxidation is now performed at a temperature of between about 850° to 950° C., to a thickness of about 400 Angstroms, to passivate the exposed LDD surface as well as the polycide sidewall. Next a plasma enhanced chemical vapor deposition, (PECVD), oxide is blanket deposited using silane at a temperature of between about 300° to 450° C., to a thickness of about 4000 Angstroms, and shown in FIG. 8 as layer 20. The thickness of the composite thermal-PECVD insulator is adjusted to a level in which trench 18A, is completely filled.

Figure 9:
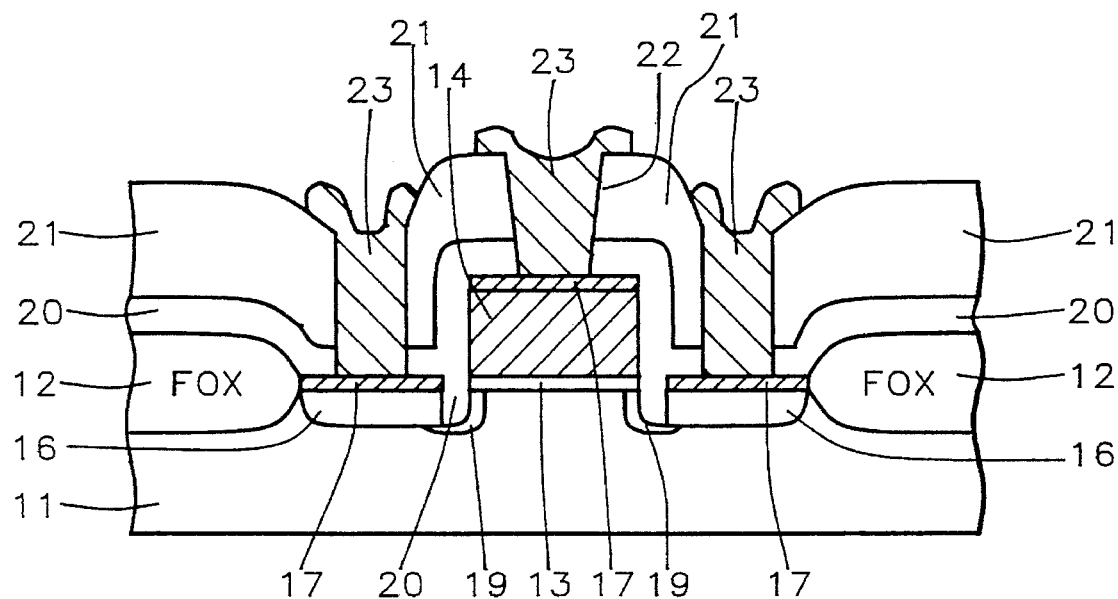

A passivation oxide layer, 21, is PECVD deposited over the surfaces of the FIG. 9 structure. The appropriate connections now have to be made to electrically connect the various gate electrodes and s/d elements to form the integrated circuit device. The contacts, 22, to the s/d and gate electrodes require an etching step that forms the openings through the passivation layer. Appropriate metallurgy, 23, is now deposited and patterned to electrically connect the s/d and gate electrode elements.

Figure 10:
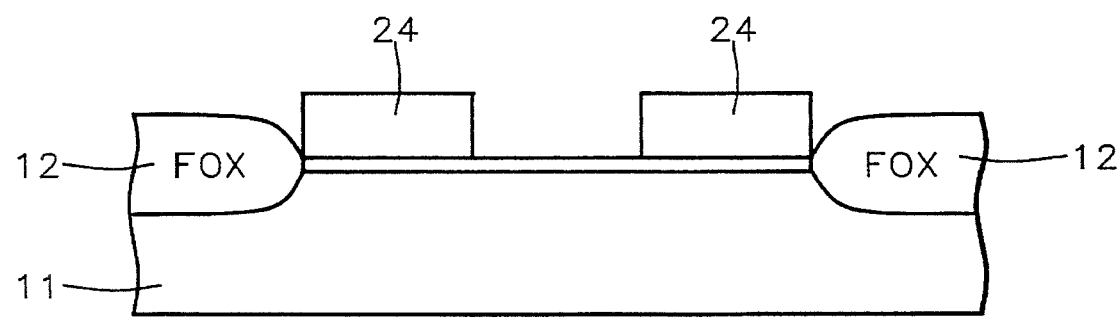
FIG. 10–13 schematically illustrate another embodiment allowing the fabrication of the LDD MOSFET device to be achieved.
Figure 11:
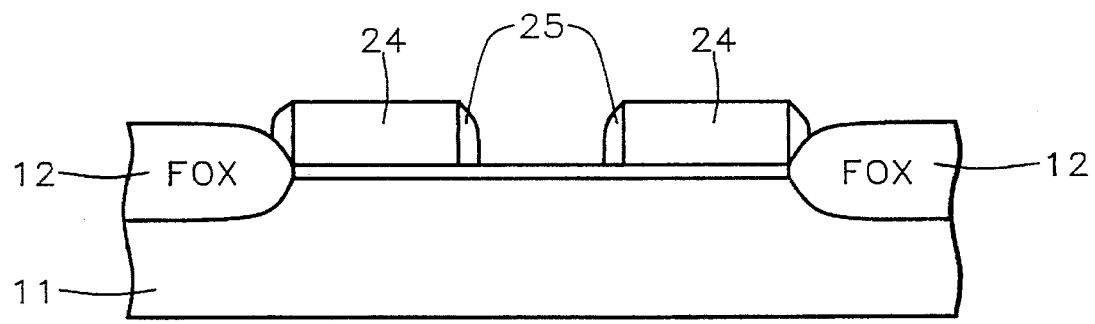

Another embodiment, enabling the recessed LDD to be obtained is now described. Using similar processing as previously described a FOX, 12, is fabricated. After removal of a pad Si3N4, used as an oxidation mask for fabrication of the FOX, a different layer of Si3N4 is grown using LPCVD at a temperature of between about 700° to 800° C., to a thickness of about 1500 Angstroms. Conventional photolithography and RIE processing is then performed to obtain the desired pattern in the Si3N4 layer and shown in FIG. 10 as layer 24. A sidewall or spacer insulator, 25, is then fabricated using PECVD SiO2 at a temperature of between about 200° to 400° C., to a thickness of about 2500 Angstroms, followed by anisotropic RIE processing. After a careful cleaning, and removal of pad oxide, (used in the FOX fabrication sequence), a gate oxide is thermally grown using O2 and steam at a temperature of between about 850° to 950° C., to a thickness of about 100 to 200 Angstroms.

Figure 12:
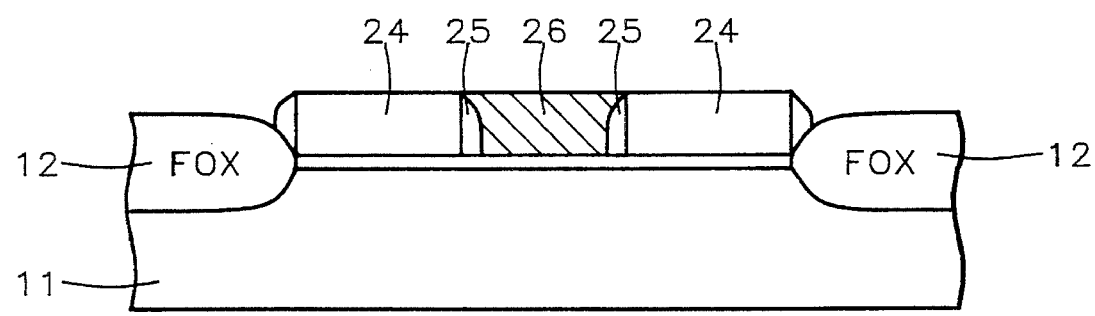
Figure 13:
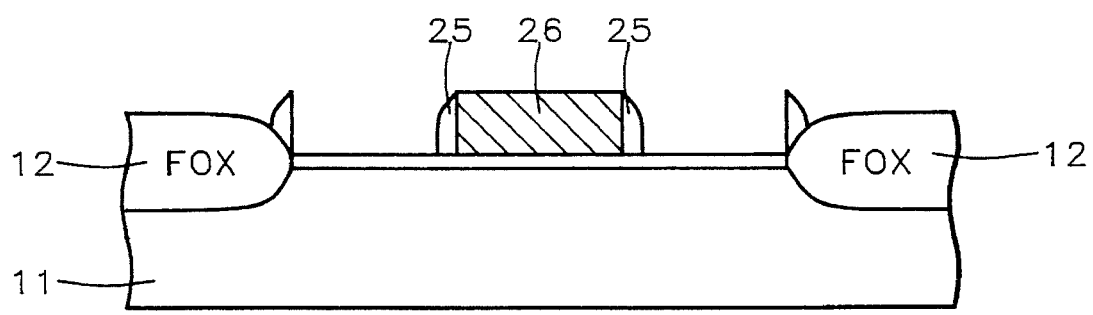

A polysilicon layer is now LPCVD deposited via use of silane at a temperature of between about 600° to 650° C., to a thickness of about 4500 Angstroms. A chemical—mechanical polishing process is now employed to remove polysilicon from all areas except from between the Si3N4 pads, 24, thus creating the polysilicon gate electrode, 26, shown in FIG. 12. A Si3N4 etch performed in H3PO4 at a temperature between about 100° to 200° C. results in the structure shown in FIG. 13. This structure is similar to the structure previously shown in FIG. 1, but achieved via a different processing scheme. The rest of the processing needed to obtain the recessed LDD MOSFET is identical to the processing previously described and shown schematically in FIGS. 2–9.

It should be noted that this invention, recessed LDD process, although shown as part of an NFET, (n-type field effect transistor), device, can be used for the fabrication of PFET devices, as well as for CMOS, (complimentary metal oxide semiconductor), and BiCMOS, (bipolar-CMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a MOSFET device on a semiconductor substrate having device regions formed therein comprising:

forming field oxide regions for isolation of a device region on the surface of said substrate;

growing a gate oxide on said device region;

depositing a polysilicon layer over said field oxide regions and over said gate oxide;

patterning to form a polysilicon gate structure within said device region on said gate oxide;

depositing a first dielectric layer;

anisotropically etching said first dielectric layer to form spacer insulators on sides of said polysilicon gate structure;

ion implanting a first conductivity imparting dopant into said device regions and into said polysilicon gate;

annealing to form source and drain regions;

depositing a metal film on all exposed areas, including said field oxide, said source and drain regions, said space insulators and said polysilicon gate structure;

annealing to form metal silicide on said source and drain regions and on said polysilicon gate structure and unreacted metal in all other areas;

removal of said unreacted metal;

removal of said spacer insulators, exposing a non-silicided portion of said semiconductor substrate;

anisotropically etching said non-silicided substrate;

ion implanting a second conductivity imparting dopant;

growing a thermal oxide; and depositing a second dielectric layer.

2. The method of claim 1 wherein said spacer insulators are silicon oxide.

3. The method of claim 1 wherein said spacer insulators are silicon nitride.

4. The method of claim 1 wherein said first conductivity imparting dopant is arsenic and is ion implanted at an energy between about 50 to 100 Kev at a dose of between about 1E15 to 1E16 atoms/cm$^2$.

5. The method of claim 1 wherein said metal is titanium.

6. The method of claim 1 wherein said metal silicided source and drain device regions and said metal silicided polysilicon gate structure are formed from annealing at a temperature between about 650° to 750° C., for time between about 25 to 35 min.

7. The method of claim 1 wherein said second conductivity imparting dopant is phosphorous, ion implanted at an energy between about 50 to 70 Kev, at a dose of between about 1E13 to 1E14 atoms/cm$^2$, and at an implant angle of greater than 20 degrees.

8. The method of claim 1 wherein second dielectric layer is silicon oxide and is formed from plasma enhanced chemical vapor deposition at a temperature between about 300° to 500° C., to a thickness from 3000 to 5000 Angstroms.

9. A method for fabricating a MOSFET device on a semiconductor substrate having device regions formed therein comprising:

forming field oxide regions for isolation of a device region on the surface of said substrate;

growing a gate oxide on said device region;

depositing a polysilicon layer over said field oxide regions and over said gate oxide;

patterning to form a polysilicon gate structure within said device region on said gate oxide;

depositing a first dielectric layer;

anisotropically etching said first dielectric layer to form spacer insulators on sides of said polysilicon gate structure;

ion implanting a first conductivity imparting dopant into said device regions and into said polysilicon gate;

annealing to form source and drain regions;

depositing a metal film on all exposed areas, including said field oxide, said source and drain regions, said space insulators, and said polysilicon gate structure;

annealing to form metal silicide on said source and drain regions and on said polysilicon gate structure and unreacted metal in all other areas;

removal of said unreacted metal;

removal of said space insulators, exposing a non-silicided portion of said semiconductor substrate;

anisotropically etching said non-silicided substrate to create a trench between said metal silicided polysilicon gate structure and said metal silicided source and drain regions;

ion implanting a second conductivity imparting dopant into bottom and sides of said trench, and under edges of said metal silicided polysilicon gate structure to form lightly doped drain regions;

growing a thermal oxide on exposed regions of said trench and on sides of said metal silicided polysilicon gate structure; and depositing a second dielectric layer, filling said trench, and overlying said metal silicided source and drain regions, said metal silicided polysilicon gate structure and said field oxide regions.

10. The method of claim 9 wherein said spacer insulators are silicon oxide.

11. The method of claim 9 wherein said spacer insulators are silicon nitride.

12. The method of claim 9 wherein said first conductivity imparting dopant is arsenic and is ion implanted at an energy between about 50 to 100 Kev at a dose of between about 1E15 to 1E16 atoms/cm$^2$.

13. The method of claim 9 wherein said metal is titanium.

14. The method of claim 9 wherein said metal silicided source and drain device regions and said metal silicided polysilicon gate structure are formed from annealing at a temperature of between about 650° to 750° C., for a time of between about 25 to 35 min.

15. The method of claim 9 wherein said trench is created by anisotropic etching in $SF_6$ and $Cl_2$.

16. The method of claim 9 wherein said trench is etched to a depth equal to the depth of said source and drain regions, which is between about 500 to 3000 Angstroms.

17. The method of claim 9 wherein second conductivity imparting dopant is phosphorous, ion implanted at an energy of between about 50 to 70 Kev, at a dose of between about 1E13 to 1E14 atoms/cm$^2$, and at an implant angle of between about 20 to 45 degrees.

18. The method of claim 9 wherein second dielectric layer is silicon oxide and is formed from plasma enhanced chemical vapor deposition at a temperature between about 300° to 500° C., to a thickness from 3000 to 5000 Angstroms.

* * * * *